(12) United States Patent
Takao

(10) Patent No.: US 6,727,557 B2
(45) Date of Patent: Apr. 27, 2004

(54) SEMICONDUCTOR DEVICE HAVING WELL TAP PROVIDED IN MEMORY CELL

(75) Inventor: Yoshihiro Takao, Kawasaki (JP)

(73) Assignee: Fujitsu Limited, Kawasaki (JP)

(*) Notice: Subject to any disclaimer, the term of this patent is extended or adjusted under 35 U.S.C. 154(b) by 0 days.

(21) Appl. No.: 10/103,823

(22) Filed: Mar. 25, 2002

(65) Prior Publication Data

US 2003/0107069 A1 Jun. 12, 2003

(30) Foreign Application Priority Data

Dec. 7, 2001 (JP) .......................... 2001-374515

(51) Int. Cl.⁷ .................. H01L 29/76; H01L 29/94; H01L 31/062; H01L 31/119; H01L 31/113; H01L 27/11

(52) U.S. Cl. .................. 257/371; 257/377; 257/384; 257/390; 257/903

(58) Field of Search ................ 257/371, 377, 257/384, 390, 903

(56) References Cited

U.S. PATENT DOCUMENTS 4,884,118 A * 11/1989 Hui et al. .................. 257/206
5,654,572 A * 8/1997 Kawase .................... 257/371
5,856,231 A    1/1999 Niemann et al.

FOREIGN PATENT DOCUMENTS

JP          8-181225        7/1996

OTHER PUBLICATIONS

N. Ohtani et al.; "Development of Large Single–Crystal SiC Substrates"; Electronics & Communications in Japan; Part 2; Jun. 1998; pp. 8–17; vol. 81; No. 6; Scripta Technica, New York, US.

R.R. Siergiej et al.; "Advances in SiC materials and devices; an industrial point of view"; Materials Science and Engineering B; Jul. 30, 1999; pp. 9–17; vol. 61–62; Elsevier Sequoia; Lausanne, CH.

St.G. Muller et al.; "Progress in the industrial production of SiC substrates for semiconductor devices"; Materials Science & Engineering B; Mar. 22, 2001; pp. 327–331; vol. 80, No. 1–3; Elsevier Sequoia, Lausanne, CH.

* cited by examiner

Primary Examiner—Nathan J. Flynn
Assistant Examiner—Victor A. Mandala, Jr.
(74) Attorney, Agent, or Firm—Westerman, Hattori, Daniels & Adrian, LLP

(57) ABSTRACT

Each of a plurality of repeating units comprises a plurality of memory cells. A second-conductivity-type well is formed in a surface layer of a semiconductor substrate extending over the plurality of the repeating units. In the second-conductivity-type well, first-conductivity-type channel MOS transistors of the plurality of the repeating units are provided. A second-conductivity-type well tap region is formed in one of the memory cells in each repeating unit and in the second-conductivity-type well. In the memory cell provided with the second-conductivity-type well tap region or in the memory cell adjacent thereto, an interlayer connection member is provided. The interlayer connection member is connected to the source region of one of the first-conductivity-type channel MOS transistors and to the corresponding second-conductivity-type well tap region.

12 Claims, 14 Drawing Sheets

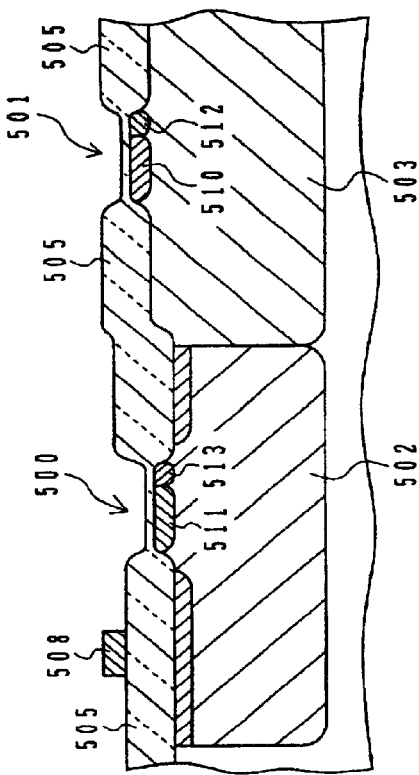
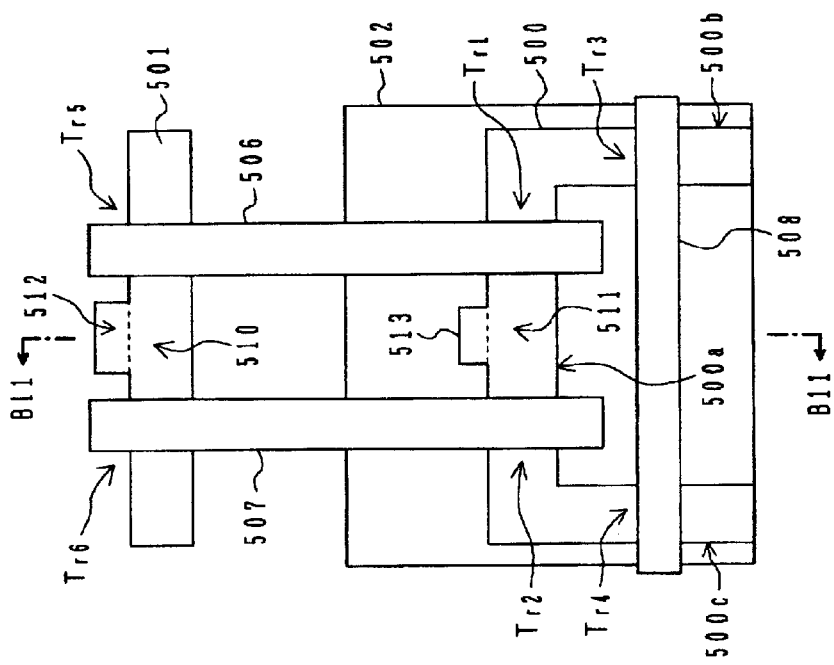
FIG.10A PRIOR ART
FIG.10B PRIOR ART

SEMICONDUCTOR DEVICE HAVING WELL TAP PROVIDED IN MEMORY CELL

CROSS REFERENCE TO RELATED APPLICATION

This invention is based on and claims priority of Japanese patent application 2001-374515, filed on Dec. 7, 2001, the whole contents of which are incorporated herein by reference.

BACKGROUND OF THE INVENTION

1. Field of the Invention

The present invention relates to semiconductor devices, and more particularly, relates to a semiconductor device which comprises a plurality of repeating units, each repeating unit being composed of a plurality of memory cells and a well tap for applying a constant voltage to a well in which MOS transistors constituting the memory cells are formed.

2. Description of the Related Art

In FIG. 10A, a plan view of a static random access memory cell (SRAM cell) disclosed in Japanese Unexamined Patent Application Publication No.8-181225 is shown. In FIG. 10B, a cross-sectional view taken along the line B10—B10 in FIG. 10A is shown.

Active regions 500 and 501 are defined by an element isolation insulation film 505. The active region 500 is provided in a p-type well 502, and the active region 501 is provided in an n-type well 503. As shown in FIG. 1A, the active 500 comprises a first portion 500a which extends in the lateral direction in the figure, and a second portion 500b and third portion 500c, which extend downward in the figure from the ends of the first portion 500a.

The active region 501 has a long shape in the lateral direction in the figure. Two gate electrodes 506 and 507 extend in the longitudinal direction in the figure and intersect the first portion 500a of the active region 500 and the active region 501. At the intersection area between the active region 500 and the gate electrode 506, a pulldown MOS transistor Tr1 is formed, and at the intersection area between the active region 500 and the gate electrode 507, a pulldown MOS transistor Tr2 is formed. At the intersection area between the active region 501 and the gate electrode 506, a pullup MOS transistor Tr5 is formed, and at the intersection area between the active region 501 and the gate electrode 507, a pullup MOS transistor Tr6 is formed.

A word line 508 extends in the lateral direction in the figure and intersects the second portion 500b and the third portion 500c of the active region 500. At the intersection area between the second portion 500b and the word line 508, a transfer MOS transistor Tr3 is formed, and at the intersection area between the third portion 500c and the word line 508, a transfer MOS transistor Tr4 is formed.

In the active region 501, between the gate electrodes 506 and 507, a p-type source region 510 is provided for the pullup transistors Tr5 and Tr6. In the active region 500, between the gate electrodes 506 and 507, an n-type source region 511 is provided for the pulldown transistors Tr1 and Tr2.

In a part of the active region 501 between the gate electrodes 506 and 507, an $n^+$-type well contact region 512 is formed. In a part of the active region 500 between the gate electrodes 506 and 507, a $p^+$-type well contact region 513 is formed. The $n^+$-type well contact region 512 is in contact with the p-type source region 510 (batting contact), and the $p^+$-type well contact region 513 is in contact with the n-type source region 511 (batting contact).

A power supply voltage Vcc is applied to the n-type well 503 via the $n^+$-type well contact region 512. A ground voltage Vss is applied to the p-type well 502 via the $p^+$-type well contact region 513.

In order to normally operate the pulldown MOS transistors Tr1 and Tr2, an n-type impurity doped in the $n^+$-type well contact region 512 must not to be doped in the vicinities of the gate electrodes 506 and 507. Doping of the impurity in the $n^+$-type well contact region 512 is performed by ion implantation using a resist pattern having an opening corresponding to the $n^+$-type well contact region 512.

In order to secure an alignment allowance when this resist pattern is formed, it is necessary that the $n^+$-type well contact region 512 be provided at a predetermined distance from the gate electrodes 506 and 507 which are disposed at both sides of the $n^+$-type well contact region 512. In a manner similar to the above, it is necessary that the $P^+$-type well contact region 513 be provided at a predetermined distance from the gate electrodes 506 and 507 which are disposed at both sides of the $P^+$-type well contact region 513.

For example, when the gate length is a generation of 0.13 μm, the distance between the gate electrode 506 and the gate electrode 507 becomes 0.7 μm. In this structure, the lateral width of one memory cell is approximately 1.55 μm. On the other hand, when the well contact regions 512 and 513 are not provided, the distance between the gate electrodes 506 and 507 can be decreased to 0.35 μm. In the above structure, the lateral width of one memory cell is 1.2 μm. When the well contact regions 512 and 513 are provided between the gate electrodes, the area of the memory cell is increased by approximately 29%.

In FIG. 11, a plan view of a conventional SRAM in which the memory cell area can be decreased is shown. Four memory cells 600a to 600d are disposed in the lateral direction in the figure to form one memory cell array 600. A plurality of the memory cell arrays 600 is repeatedly disposed in the lateral direction and in the longitudinal direction in the figure, and between adjacent memory cell arrays in the lateral direction, a connection portion 605 is secured.

Each of the memory cells 600a to 600d comprises two pulldown MOS transistors Tr1 and Tr2, two pullup MOS transistors Tr5 and Tr6, and two transfer MOS transistors Tr3 and Tr4. In the memory cells 600a to 600d, well contact regions are not provided.

A p-type well 601 and an n-type well 602 are provided to extend in the lateral direction in the figure. In the p-type well 601, n-channel MOS transistors of the memory cells are formed, and in the n-well 602, p-channel MOS transistors are formed. A word line 606 is provided to extend in the lateral direction in the figure and is also used as gate electrodes of the transfer MOS transistors Tr3 and Tr4.

In the p-type well 601 and the n-type well 602 in the connection portion 605, a p-type well tap region 610 and an n-type well tap region 611 are provided, respectively. In the connection portion 605, a via hole 614 is provided for connecting the word line 606 to a main word line provided thereabove.

In FIG. 12, a cross-sectional view taken along the chain line A12—A12 in FIG. 11 is shown. The p-type well tap region 610 is connected to an intermediate conductive layer 623 via a conductive material filled in a via hole 612 formed in an interlayer insulating film 620. The intermediate conductive layer 623 is further connected to a ground voltage line which is provided thereon.

The n-type well tap region 611 is connected to an intermediate conductive layer 622 via the conductive material filled in a via hole 613 formed in the interlayer insulating film 620. The intermediate conductive layer 622 is further connected to a power supply voltage line which is provided above. The word line 606 is connected to an intermediate conductive layer 621 via the conductive material filled in a via hole 614 formed in the interlayer insulating film 620. The intermediate conductive layer 621 is connected to a main word line provided thereabove. In general, the main word line is formed of a metal, and as a result, an effective electrical resistance of the word line 606 formed of polycrystalline silicon is decreased.

In the conventional SRAM shown in FIGS. 11 and 12, well tap regions are not provided in individual memory cells, and in the connection portion 605 provided for every four memory cells, the well tap regions are provided. Accordingly, the areas of the well tap regions per one memory cell can be decreased.

FIG. 13 shows an enlarged plan view of the connection portion 605 of the conventional SRAM shown in FIG. 11. At the right side and the left side of the n-type well tap region 611 in the figure, a source region 630 of the pullup MOS transistor Tr5 of the memory cell disposed at one end of a memory cell array and a source region 631 of a pullup MOS transistor Tr6 of the memory cell disposed at one end of a memory cell array opposite to the memory cell array mentioned above with respect to the n-type well tap region 611 are provided, respectively.

Above the n-type well tap region 611, the intermediate conductive layer 622 is provided. Above the drain regions 630 and 631, intermediate conductive layers 632 and 633 are provided, respectively. The distance D between the intermediate conductive layers 622 and 632 adjacent to each other and the distance D between the intermediate conductive layers 622 and 633 are set to the minimum dimension used for patterning a wire layer of the semiconductor device.

The width of the connection portion 605 is restricted by the distance D which is set to the minimum dimension. In particular, the source region 630 of the pullup MOS transistor Tr5 of the memory cell array and the source region 631 of the pullup MOS transistor Tr6 of the memory cell array, which are opposite to each other with respect to the connection portion 605, must be provided apart from each other at a distance of at least two times the minimum dimension.

When the gate length is a generation of 0.13 $\mu$m, the lateral width of the memory cell is approximately 1.2 $\mu$m, and the width of the connection portion is approximately 1 $\mu$m. When one connection portion is provided for every four memory cells, the effective lateral width of one memory cell is 1.45 $\mu$m in consideration of the connection portion.

SUMMARY OF THE INVENTION

Accordingly, an object of the present invention is to increase the degree of integration of a semiconductor device in which a plurality of circuits such as memory cells, which are substantially equivalent to each other, are provided repeatedly.

A semiconductor device according to one aspect of the present invention comprises a plurality of repeating units repeatedly provided on a surface of a semiconductor substrate in a first direction and a second direction crossing to the first direction, each repeating unit comprising a plurality of memory cells, each memory cell comprising at least one first-conductivity-type channel MOS transistor having a first-conductivity-type source region, a first-conductivity-type drain region, and a gate electrode; a second-conductivity-type well provided in a surface layer of the semiconductor substrate, the second-conductivity type well extending over the plurality of the repeating units disposed in the first direction, the first-conductivity-type channel MOS transistor of each memory cell being provided on the second-conductivity-type well; a second-conductivity-type well tap region provided in one of the plurality of the memory cells in each repeating unit and in the second-conductivity-type well; an interlayer insulating film covering the surface of the semiconductor substrate; and a first interlayer connection member which is provided in the memory cell having the second-conductivity-type well tap region in each repeating unit or in the memory cell adjacent thereto and which penetrates the interlayer insulating film, the first interlayer connection member being connected to at least the source region of one of the first-conductivity-type channel MOS transistors of the memory cell in which the first interlayer connection member is provided and to the second-conductivity-type well tap region.

A constant voltage is applied to the source region of a first-conductivity-type MOS transistor and the second-conductivity-type well tap region via the first interlayer connection member. Since an interlayer connection member exclusively used for the well tap region is not necessary, the degree of integration of the semiconductor device can be increased.

As described above, the interlayer connection member for applying a constant voltage to the well tap region is also used as an interlayer connection member for applying a constant voltage to the source region of a MOS transistor adjacent to the well tap region. Accordingly, the interlayer connection member exclusively used for the well tap region is not necessary, and as a result, the degree of integration of the semiconductor can be increased.

BRIEF DESCRIPTION OF THE DRAWINGS

FIGS. 10A and 10B are a plan view and a cross-sectional view of a conventional SRAM, respectively;

DESCRIPTION OF THE PREFERRED EMBODIMENTS

Figure 1:
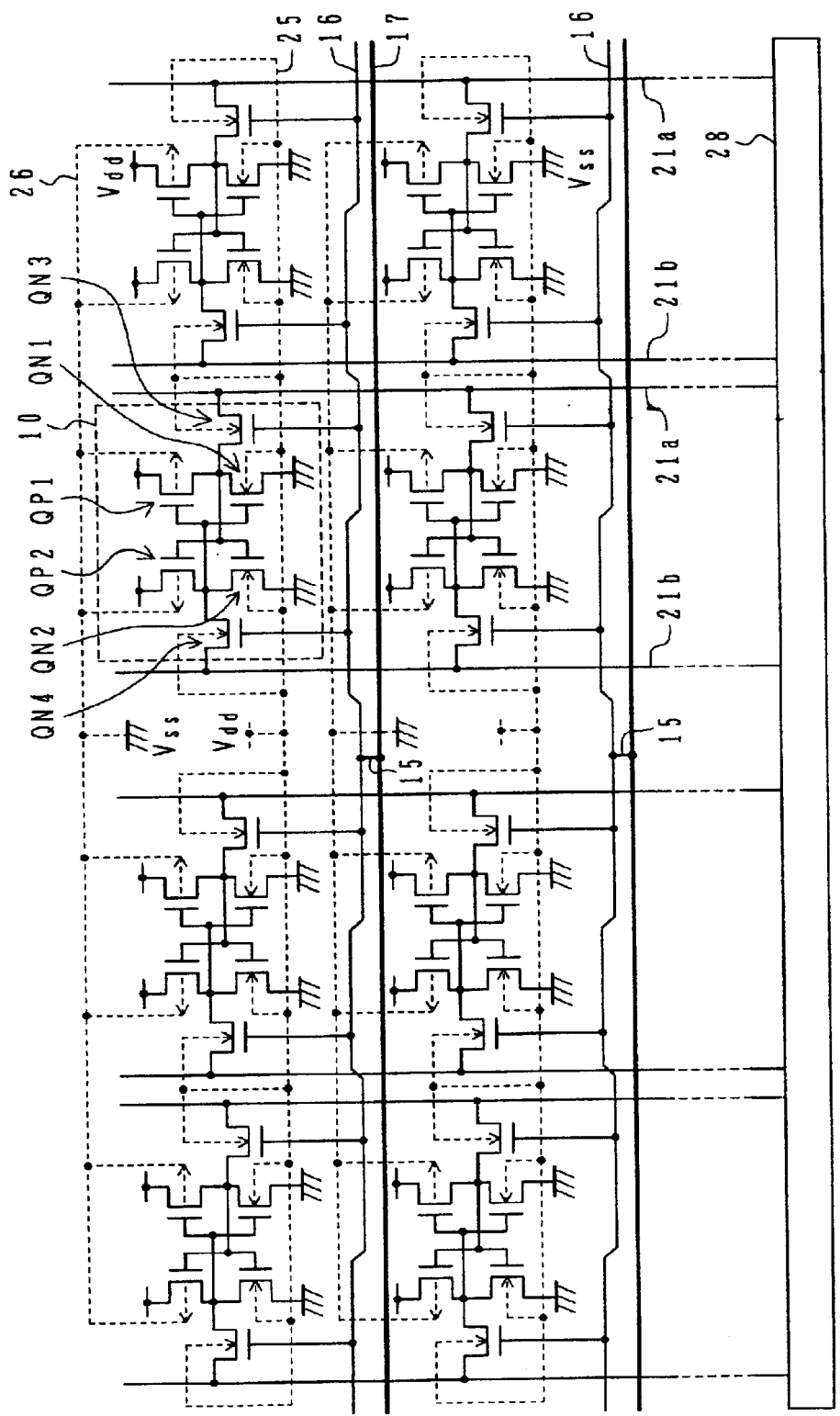
FIG. 1 is an equivalent circuit of an SRAM according to an embodiment of the present invention.

FIG. 1 shows an equivalent circuit of an SRAM according to an embodiment of the present invention. Each of memory cells 10 comprises p-channel pullup MOS transistors QP1 and QP2, n-channel pulldown MOS transistors QN1 and QN2, and n-channel transfer MOS transistors QN3 and QN4.

Drain terminals of the pullup MOS transistor QP1 and the pulldown MOS transistor QN1 are connected to each other, so that an inverter is formed. In addition, drain terminals of the pullup MOS transistor QP2 and the pulldown MOS transistor QN2 are connected to each other, so that another inverter is formed. The output of one of the inverters is input to the other inverter. A power supply voltage Vdd is applied to the source terminals of the pullup MOS transistors QP1 and QP2. A ground voltage Vss is applied to the source terminals of the pulldown MOS transistors QN1 and QN2.

The memory cells 10 are provided repeatedly in the row direction and in the column direction. Four memory cells disposed in the row direction form on memory cell array (a repeating unit).

A word line 16 is provided to each row of the memory cells 10. A bit line 21a and an inverted bit line 21b are provided to each column of the memory cells 10. The bit line 21a and the inverted bit line 21b are connected to a sense amplifier 28.

The transfer MOS transistor QN3 of each memory cell 10 connects the output point (the drain of a MOS transistor) of the inverter formed of the MOS transistors QP1 and QN1 to the associated bit line 21a. The transfer MOS transistor QN4 connects the output point of the inverter formed of the MOS transistors QP2 and QN2 to the associated inverted bit line 21b. The gate electrodes of the transfer MOS transistors QN3 and QN4 are connected to the associated word line 16.

A main word line 17 is provided parallel to the word line 16. One connection member 15 connecting the word line 16 and the main word line 17 to each other is provided for each memory cell array.

Corresponding to each row of memory cells 10, a p-type well 25 and an n-type well 26 are provided. The n-channel MOS transistors QN1 to QN4 are provided in the p-type well 25, and the p-channel MOS transistors QP1 and QP2 are provided in the n-type well 26. The p-type well 25 is connected to a wire of the power supply voltage Vdd, and the n-type well 26 is connected to a wire of the ground voltage Vss. These connection points described above are provided for each memory cell array.

Figure 2:
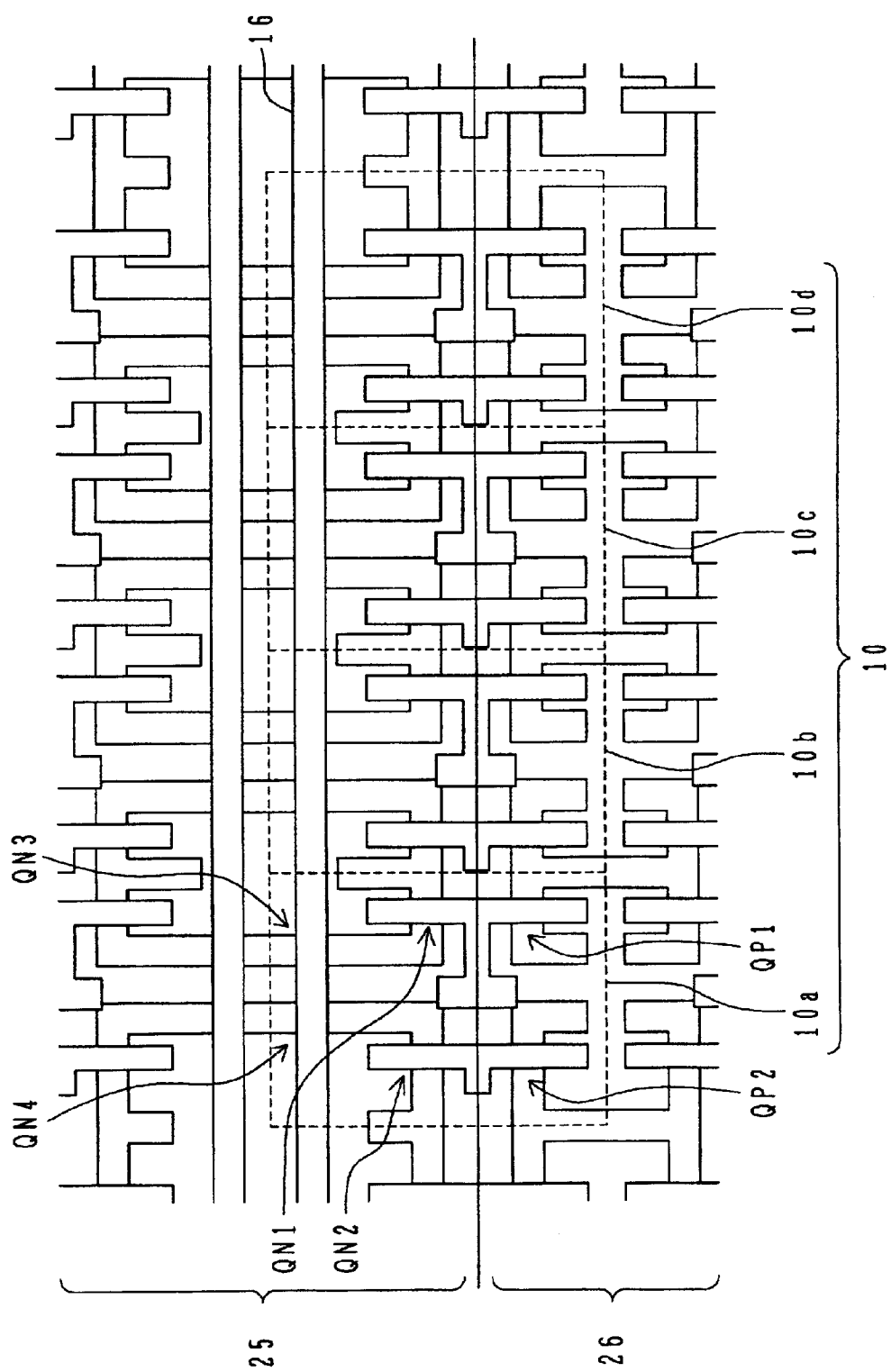
FIG. 2 is a plan view showing the arrangement of active regions and gate electrodes of an SRAM according to an embodiment of the present invention.

FIG. 2 shows a plan view of the SRAM according to the embodiment. Four memory cells 10a to 10d disposed in the row direction in the figure form one memory cell array (a repeating unit) 10. Two memory cells 10b and 10c, which are located at the inner side of the memory cell array 10, have the same structure, and memory cells 10a and 10d, which are located at both ends of the memory cell array 10, each have the structure slightly different from that of the inside memory cell 10b or 10c. The structures of the individual memory cells will be described later in detail with reference to FIGS. 3 to 7.

The memory cell arrays 10 are repeatedly provided in the row direction and in the column direction. The memory cells 10a to 10d each comprise the p-channel pullup MOS transistors QP1 and QP2, the n-channel pulldown MOS transistors QN1 and QN2, and the n-channel transfer MOS transistors QN3 and QN4.

Corresponding to each row of the memory cell arrays 10, the p-type well 25 and the n-type well 26 are provided. The p-type well 25 and the n-type well 26 each extend in the row direction and are each provided under the plurality of the memory cell arrays 10 disposed in the row direction. In this connection, one p-type well 25 is provided for two rows of memory cell arrays adjacent to each other, and one n-type well 26 is provided for two rows of memory cells adjacent to each other. The word line 16 which extends in the row direction is also used as gate electrodes of the transfer MOS transistors QN3 and QN4.

Hereinafter, referring to FIGS. 3 to 7, the structure of the SRAM shown in FIG. 2 will be described in detail.

Figure 3:
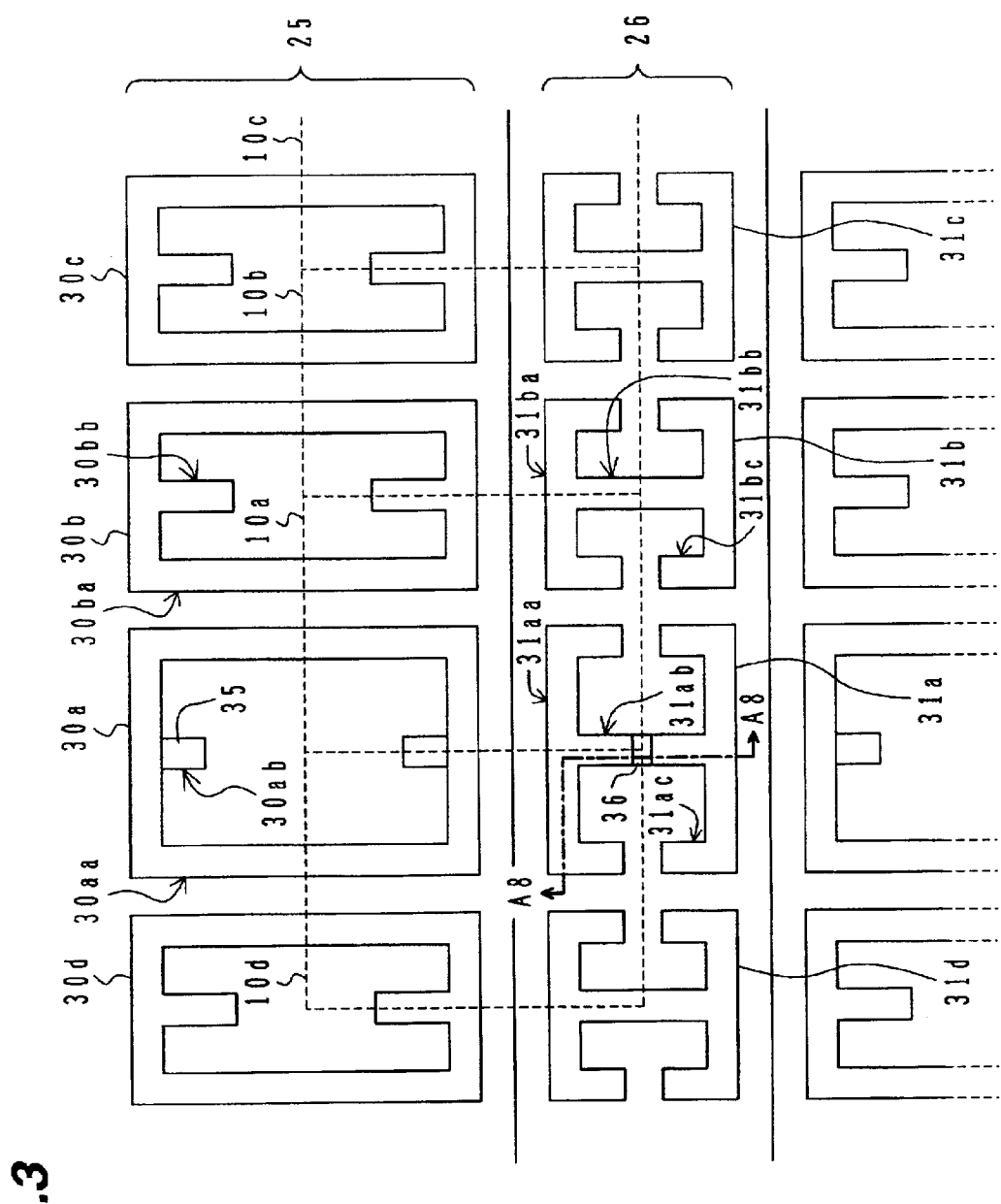
FIG. 3 is a plan view showing the arrangement of active regions of an SRAM according to an embodiment of the present invention.

FIG. 3 shows a pattern of active regions. A long p-type well 25 and a long n-type well 26, which extend in the row direction (lateral direction) in FIG. 3, are provided in the surface portion of a silicon substrate.

In the p-type well 25, active regions 30a to 30d are disposed from the left to the right in the row direction, and these four active regions 30a to 30d form one repeating unit. This repeating unit described above is repeatedly provided in the row direction. In FIG. 3, the active region 30d is provided at the left side.

The active region 30b comprises a frame portion 30ba in a rectangular shape having a long side in the longitudinal direction (column direction) in the figure, and protruding portions 30bb protruding from the upper side and the lower side of the frame portion 30ba towards the center. The active regions 30c and 30d have the same shape as that of the active region 30b.

The active region 30a comprises a frame portion 30aa in a rectangular shape having a long side in the longitudinal direction in the figure, and protruding portions 30ab protruding from the upper side and the lower side of the frame portion 30aa towards the center. The upper side and the lower side of the frame portion 30aa are slightly longer than the upper side and the lower side of the frame portion 30ba of the memory cell 30b. For example, the distance between the centers of the active regions 30b and 30c in the lateral direction is 1.2 μm, and the distance between the centers of the active regions 30a and 30b in the lateral direction is 1.4 μm.

A p-type well tap region 35 doped with a p-type impurity is provided in the protruding portion 30ab of the active region 30a.

In the n-type well 26, active regions 31a to 31d are provided. The active regions 31a to 31d are provided at the same positions as those of the active regions 30a to 30d in the lateral direction, respectively.

The active region 31b comprises two lateral portions 31ba which form the upper side and the lower side of a quadrate; a longitudinal portion 31bb which connects the two lateral portions 31ba to each other at the centers thereof; and protruding portions 31bc provided at both ends of each lateral portion 31ba, in which each protruding portion 31bc of the lateral portion extends toward the associated end of the other lateral portion.

The active region 31a comprises two lateral portions 31aa which form the upper side and the lower side of a rectangular shape having a long side in the lateral direction; a longitudinal portion 31ab which connects the two lateral portions 31aa to each other at the centers thereof; and protruding portions 31ac provided at both ends of each lateral portions 31aa, in which each protruding portion 31ac of the lateral portion extends toward the associated end of the other lateral portion.

At the center of the longitudinal portion 31ab, an n-type well tap region 36 doped with an n-type impurity is provided.

One-fourth of the active region 30b at the lower right, one-fourth of the active region 30c at the lower left, one-fourth of the active region 31b at the upper right, and one-fourth of the active region 31c at the upper left constitute the memory cell 10b. One-fourth of the active region 30a at the lower right, one-fourth of the active region 30b at the lower left, one-fourth of the active region 31a at the upper right, and one-fourth of the active region 31b at the upper left constitute the memory cell 10a provided at the left end in the memory cell array.

Figure 4:
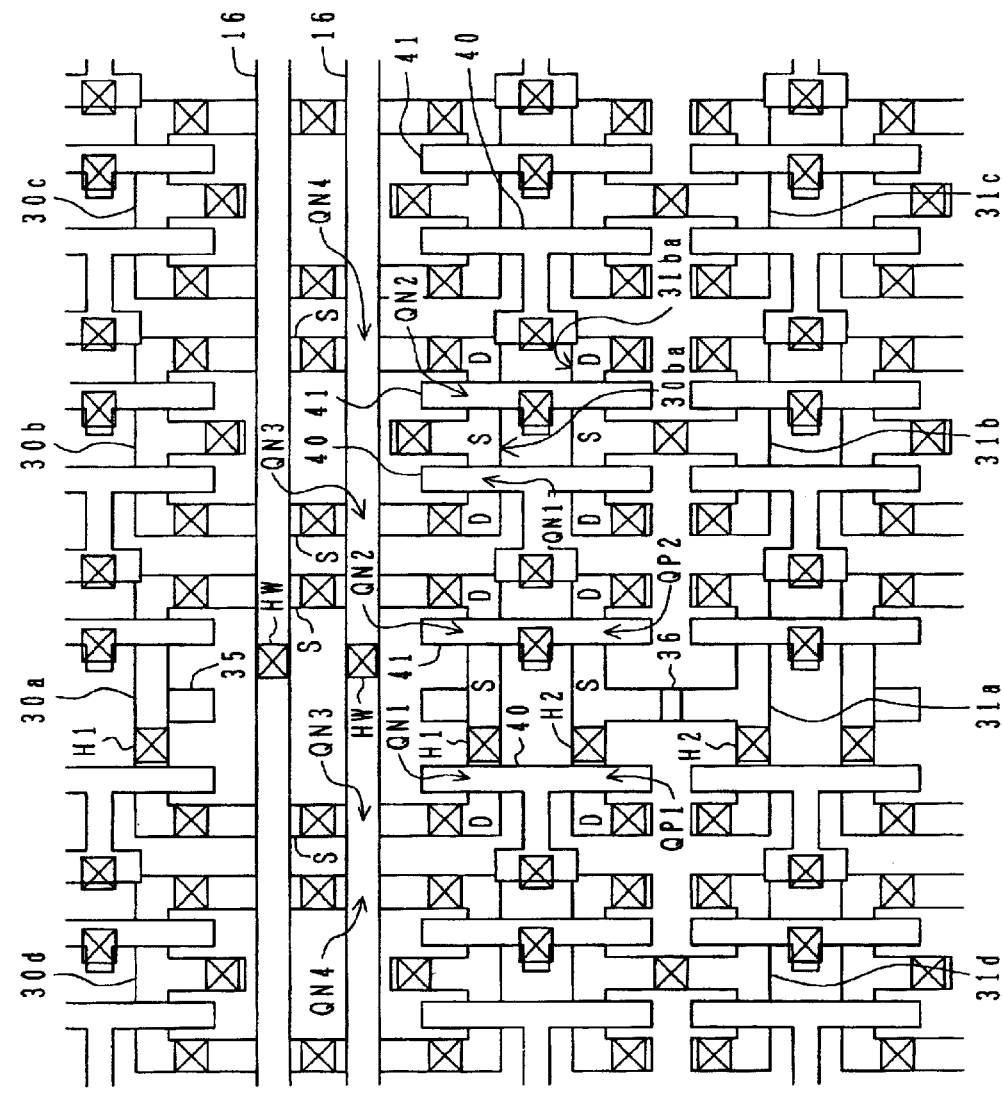
FIG. 4 is a plan view showing a pattern of a layer on which gate electrodes of an SRAM according to an embodiment of the present invention.

In FIG. 4, a pattern of a polycrystalline silicon layer formed on the silicon substrate, and positions of via holes for connecting the pattern to an upper wire layer.

Two gate electrodes 40 and 41 intersect the side extending in the lateral direction of the frame portion 30ba of the active region 30b and the lateral portion 31ba of the active region 31b adjacent to the active region 30b in the longitudinal direction. The pair of the active regions 30c and 31c and the pair of the active regions 30d and 31d each have the same structure as that described above.

Two gate electrodes 40 and 41 intersect the side extending in the lateral direction of the frame portion 30aa of the active region 30a and the lateral portion 31aa of the active region 31a adjacent to the active region 30a in the longitudinal direction.

At the intersection between the gate electrode 40 and the active region 30b and at the intersection between the gate electrode 40 and the active region 30a, the pulldown MOS transistors QN1 are provided. At the intersection between the gate electrode 41 and the active region 30b and at the intersection between the gate electrode 41 and the active region 30a, the pulldown MOS transistors QN2 are provided. At the intersection between the gate electrode 40 and the active region 31b and at the intersection between the gate electrode 40 and the active region 31a, the pullup MOS transistors QP1 are provided. At the intersection between the gate electrode 41 and the active region 31b and at the intersection between the gate electrode 41 and the active region 31a, the pullup MOS transistors QP2 are provided.

The word line 16 extending in the lateral direction in the figure intersects the longitudinal sides of the frame portions 30aa and 30ba of the active regions 30a and 30b, respectively. Two word lines 16 intersect each of the active regions 30a and 30b. At the intersection between the word line 16 and the active region 30a, the transfer MOS transistors QN3 and QN4 are provided, and at the intersection between the word line 16 and the active region 30b, the transfer MOS transistors QN3 and QN4 are provided.

In the active region between the gate electrodes 40 and 41, source regions S of the MOS transistors are provided. Drain regions D are provided at areas each opposite to the source region with respect to the gate electrode. In the active regions between the two word lines 16, source regions S of the transfer MOS transistors are provided.

A word contact hole HW is provided at an area which overlaps the word line 16 and which is surrounded by the frame portion 30aa of the active region 30a. The word contact hole HW is provided in the memory cell 10a shown in FIG. 3. In the active region 30a, a via hole H1 is provided in the source region S between the gate electrodes 40 and 41. The via hole H1 is provided at a different position in the lateral direction in the figure from that of the word contact hole HW and is provided in the memory cell 10d shown in FIG. 3. That is, the via hole H1 and the word contact hole HW are provided in different memory cells which are adjacent to each other.

In the active region 31a, a via hole H2 is provided in the source region between the gate electrodes 40 and 41. The via hole H2 is provided at approximately the same place as that of the via hole H1 in the lateral direction in the figure. Via holes are provided corresponding to the other source regions, drain regions, and gate electrodes.

Figure 5:
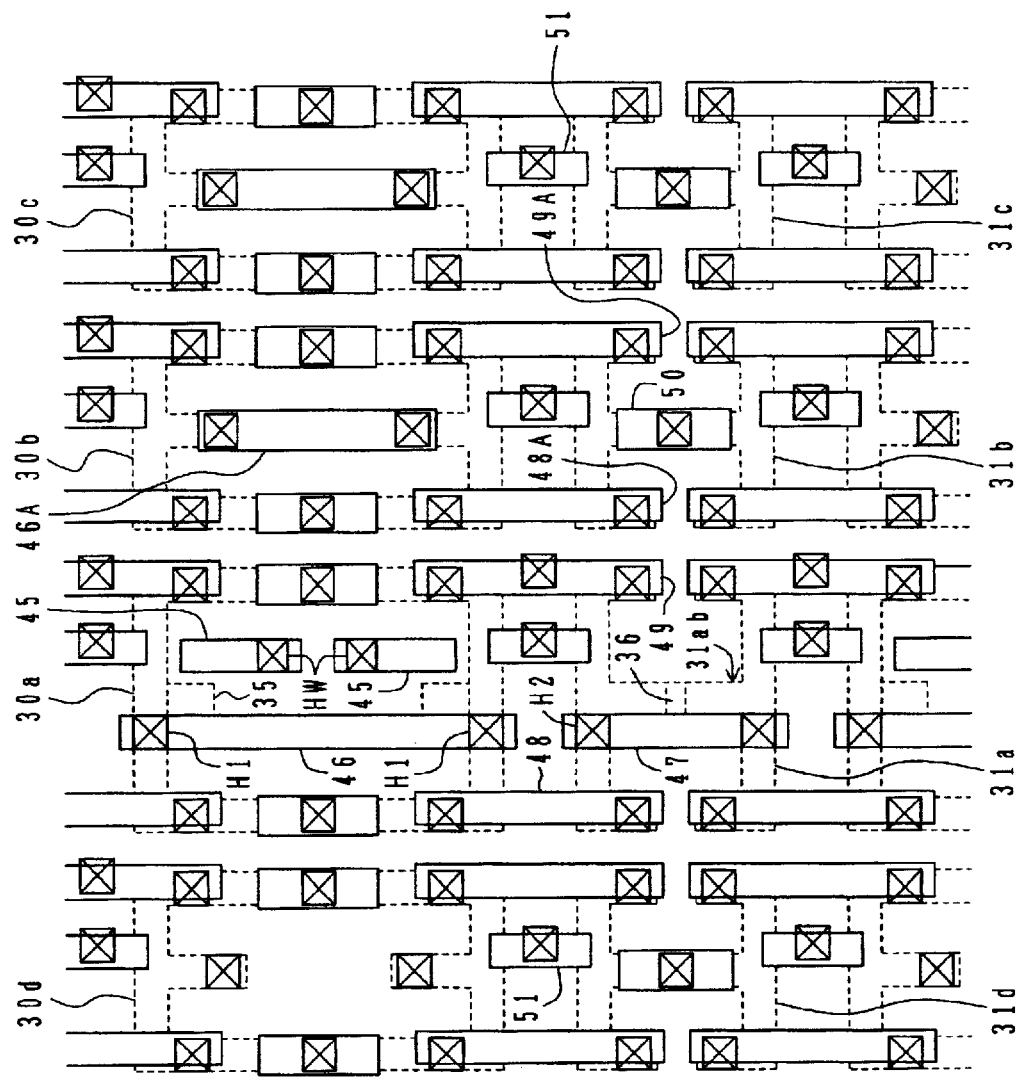
FIG. 5 is a plan view showing a pattern of first wire layers of an SRAM according to an embodiment of the present invention.

In FIG. 5, a pattern of first wire layers is shown, and in addition, the via holes shown in FIG. 4 are again shown. Corresponding to the word contact hole HW, an intermediate conductive layer 45 is provided. In the column in which the active regions 30a and 31a are provided, a wire layer 46 connects the two via holes H1 (the source regions of the n-channel MOS transistors QN1 of the adjacent memory cells in the longitudinal direction in the figure) in the same active region 30a to each other. A wire layer 47 connects the two via holes H2 (the source regions of the p-channel MOS transistors QP1 of the adjacent memory cells in the longitudinal direction in the figure) in the same active region 31a to each other. In the active region 31a, since the n-type well tap region 36 is provided at the center of the longitudinal portion 31ab, the source regions S on the upper side and on the lower side of the n-type well tap region 36 in the figure are not connected to each other via the surface portion of the silicon substrate. The wire layer 47 connects these two source regions S to each other.

A wire layer 48 connects the drain region D of the pullup MOS transistor QP1 to the drain region D of the pulldown MOS transistor QN1 in the same memory cell. A wire layer 49 connects the drain region D of the pullup MOS transistor QP2 to the drain region D of the pulldown MOS transistor QN2.

In each of the columns in which the active regions 30b to 30d and the active regions 31b to 31d are provided, a wire layer 46A connects the source regions of the n-channel MOS transistors to each other. A Wire layer 48A connects the drain region D of the pullup MOS transistor QP1 to the drain region D of the pulldown MOS transistor QN1. A wire layer 49A connects the drain region D of the pullup MOS transistor QP2 to the drain region D of the pulldown MOS transistor QN2.

The wire layers 49 and 49A are each connected to the associated gate electrode 40 shown in FIG. 4. These connections correspond to the output point of the inverter formed of the MOS transistors QP2 and QN2 and to the input point of the inverter formed of the MOS transistors QP1 and QN1 shown in FIG. 1.

In the columns in which the active regions 30b to 30d and the active regions 31b to 31d are provided, since the n-type well tap region 36 is not provided, a wire layer corresponding to the wire layer 47 is not provided. Instead of that, an intermediate conductive layer 50, connected to the common source region S used for the four p-channel MOS transistors formed in the active region 31b, is provided. In this connection, in the columns in which the active regions 30b to 30d and the active regions 31b to 31d are provided, since the word contact hole HW is not provided, conductive layers corresponding to the intermediate conductive layer 45 are not provided.

In addition, an intermediate conductive layer 51 connected to the gate electrode 41 shown in FIG. 4 is provided.

Figure 6:
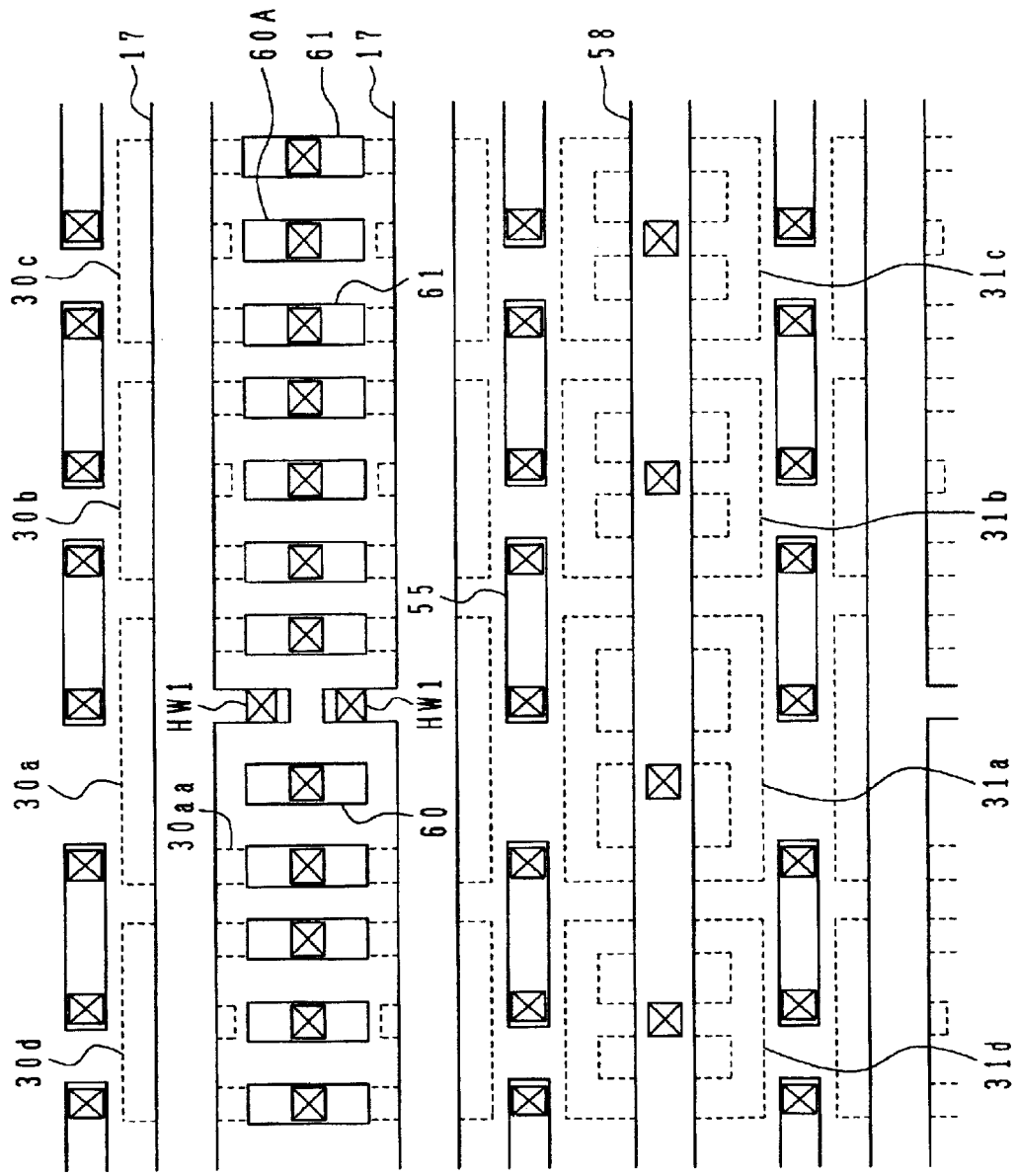
FIG. 6 is a plan view showing a pattern of second wire layers of an SRAM according to an embodiment of the present invention.

FIG. 6 shows a pattern of second wire layers and via holes to be used for connecting the second wire layers to the first wire layers shown in FIG. 5. The main word lines 17 corresponding to the word lines 16 shown in FIG. 4 are provided. The main word line 17 is connected to the intermediate conductive layer 45 shown in FIG. 5 via a word contact hole HW1 provided in an area surrounded by the frame portion 30aa of the active region 30a. That is, the main word line 17 is connected to the associated word line 16 via the intermediate conductive layer 45.

A wire layer 55 is provided in each memory cell. The wire layer 55 connects the wire layer 48 to the intermediate conductive layer 51 shown in FIG. 5 in the memory cell 10a shown in FIG. 2, and in each of the memory cells 10b to 10d shown in FIG. 2, the wire layer 55 connects the wire layer 48A to the intermediate conductive layer 51 shown in FIG. 5.

Corresponding to the row in which the active regions 31a to 31d are provided, a power supply line 58 is provided. The power supply line 58 is connected to the intermediate conductive layer 50 and the wire layer 47 in the associated row shown in FIG. 5. Accordingly, the power supply voltage Vdd is applied to the source regions S in the active regions 31a to 31d shown in FIG. 4. In addition, as described later, the source region S in the active region 31a is electrically connected to the n-type well tap region 36 via a metal silicide film formed on the surface of the source region S. Accordingly, the power supply voltage Vdd is also applied to the n-type well tap region 36. As a result, a potential of the n-type well 26 shown in FIG. 3 is fixed.

Intermediate conductive layers 60 and 60A are connected to the wires layers 46 and 46A shown in FIG. 5, respectively. Intermediate conductive layers 61 are connected to the source regions S of the active regions 30a to 30d between the two word lines 16 shown in FIG. 4.

Figure 7:
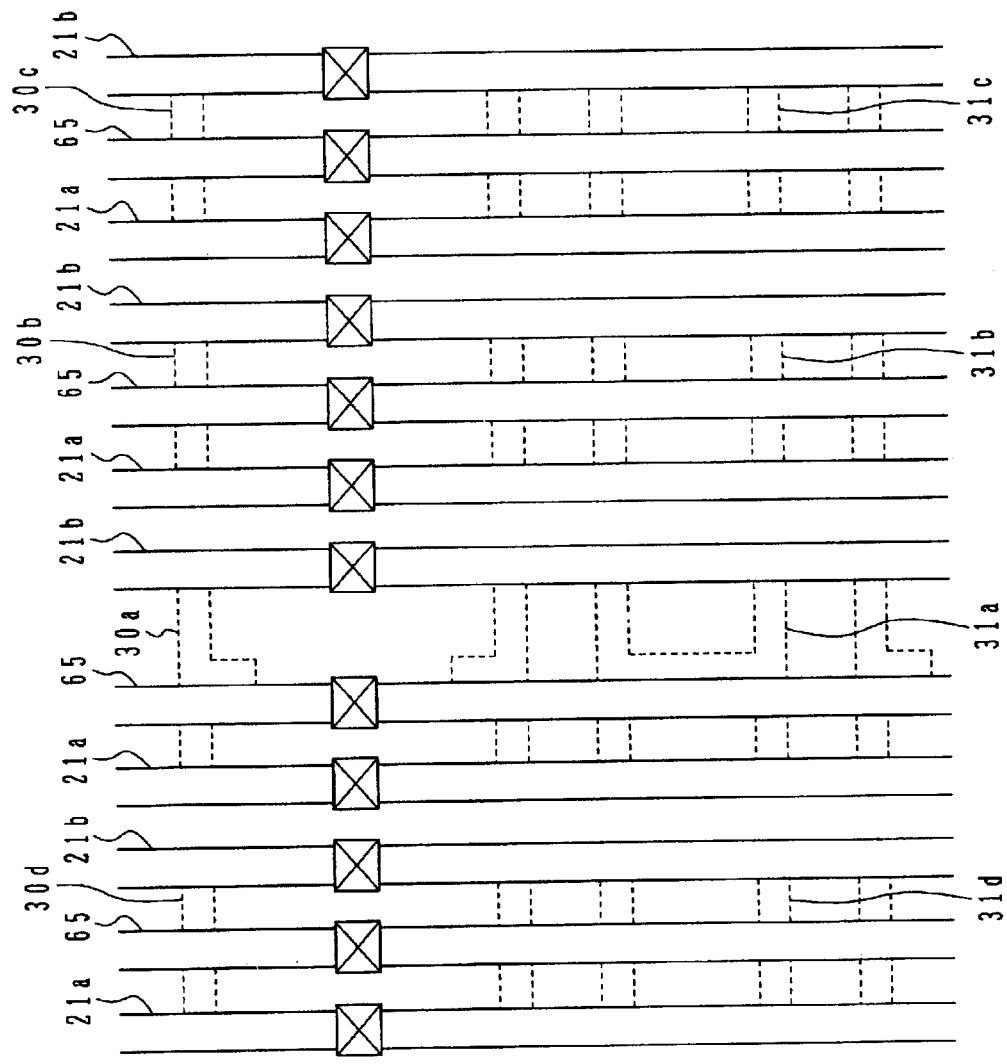
FIG. 7 is a plan view showing a pattern of third wire layers of an SRAM according to an embodiment of the present invention.

FIG. 7 shows a pattern of third wire layers and via holes to be used for connecting the third wire layers to the wire layers thereunder. The bit lines 21a extend in the longitudinal direction along the left sides in the figure of the individual active regions 30a to 30d. The inverted bit lines 21b extend in the longitudinal direction along the right sides in the figure of the individual active regions 30a to 30d. The ground voltage lines 65 extend in the longitudinal direction so as to intersect the sides in the lateral direction of the active regions 30a to 30d.

The ground voltage lines 65 are connected to the intermediate conductive layers 60 and 60A. The ground voltage Vss is applied to the source regions S between the gate electrodes 40 and 41 in the active regions 30a to 30d shown in FIG. 4 via the intermediate conductive layers 60 and 60A and the wire layers 46 and 46A shown in FIG. 5. A metal silicide film is formed on the upper surface of the source region S of the active region 30a and on the upper surface of the p-type well tap region 35, so that they are electrically connected to each other. The ground voltage Vss is applied to the p-type well tap region 35 via this metal silicide film. Accordingly, the p-type well 25 is fixed at a ground voltage Vss.

Next, referring to FIGS. 8A to 8E, a method for manufacturing the SRAM according to the above embodiment will be described. FIGS. 8A to 8E are views each corresponding to a cross-sectional view taken along the chain line A8—A8 in FIG. 3.

Figure 8A:
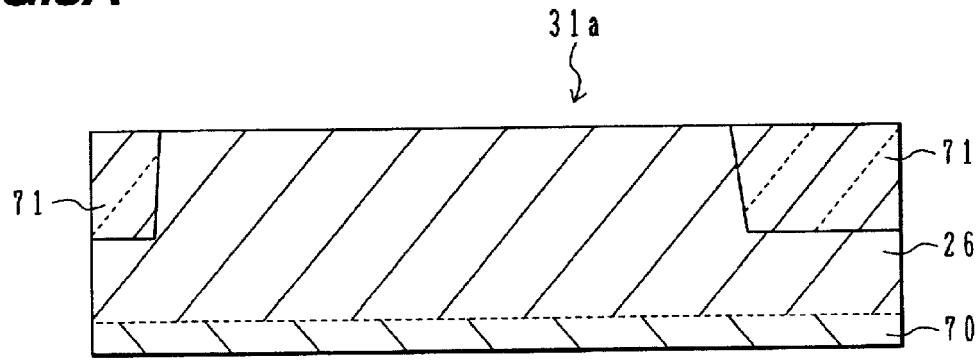
FIGS. 8A to 8E are cross-sectional views of a substrate for illustrating a method for manufacturing an SRAM according to an embodiment of the present invention.

As shown in FIG. 8A, in the surface portion of a p-type silicon substrate 70, an element isolation insulation film 71 having a shallow trench isolation (STI) structure is formed. The element isolation insulation film 71 is formed by the steps of forming a groove 300 nm deep, forming a silicon oxide film 500 nm thick by chemical vapor deposition (CVD), and performing chemical mechanical polishing (CMP). Accordingly, the active region 31a surrounded by the element isolation insulation film 71 is formed.

Phosphorus (P) ions are implanted at an accelerated energy of 600 keV and at a dose amount of $3\times10^{13}$ cm$^{-2}$ using a resist pattern as a mask having an opening corresponding to an area at which the n-type well 26 is formed. Accordingly, the n-type well 26 is formed. In a manner similar to the above, by implanting boron (B) ions at an accelerated energy of 300 keV and at a dose amount of $3\times10^{13}$ cm$^{-2}$, the p-type well 25 shown in FIG. 2 is formed.

Figure 8B:
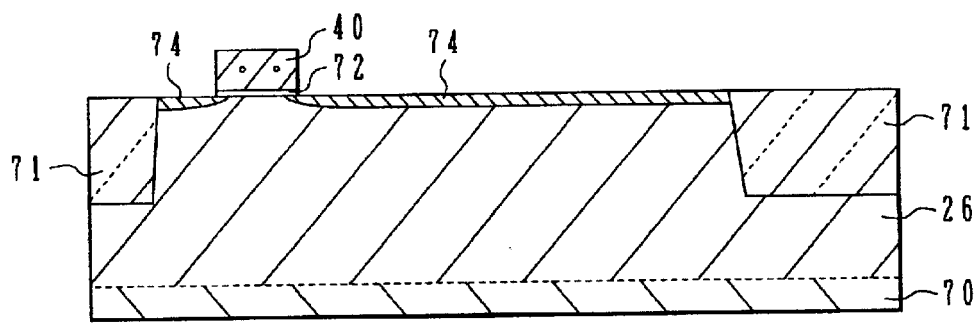

Steps of obtaining the state shown in FIG. 8B will be described. The surface of the active region on the silicon substrate 70 is thermally oxidized to form a silicon oxide film 4 nm thick. On this silicon oxide film and the element isolation insulation film 71, a polycrystalline silicon 180 nm thick is formed by CVD. The polycrystalline silicon film and the silicon oxide film are patterned so that gate insulating films 72 composed of the silicon oxide and the gate electrodes 40 composed of the polycrystalline silicon are formed. In the steps described above, the other gate electrodes 41 and the word lines 16 shown in FIG. 4 are also formed.

In an area at which the p-channel MOS transistor is formed, boron (B$^+$) ions are implanted at an accelerated energy of 0.5 keV and at a dose amount of $8\times10^{14}$ cm$^{-2}$. By this ion implantation, a lightly doped region 74 having a lightly doped drain (LDD) structure is formed. In an area at which an n-channel MOS transistor is formed, arsenic (As$^+$) ions are implanted at an accelerated energy of 5 keV and at a dose amount of $8\times10^{14}$ cm$^{-2}$.

Figure 8C:
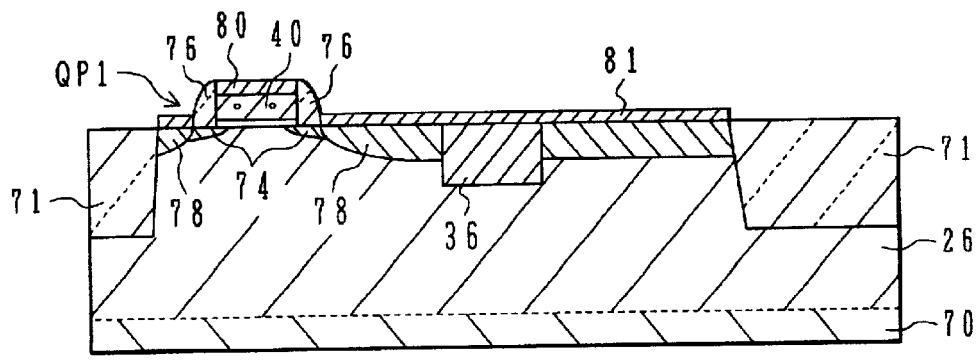

As shown in FIG. 8C, on the side surfaces of the gate electrode 40, side wall spacers 76 composed of silicon oxide are formed. The side wall spacer 76 is formed by deposition of a silicon oxide film 100 nm thick by CVD followed by anisotropic etching.

In the area at which the p-channel MOS transistor is formed, boron (B$^+$) ions are implanted at an accelerated energy of 5 keV and at a dose amount of $1\times10^{15}$ cm$^{-2}$. By this ion implantation, a source and a drain region 78 are formed. In addition, boron ions are also implanted at the same time in the p-type well tap region 35 show in FIG. 4. By the steps described above, the p-channel MOS transistor QP1 is formed.

In the area at which the n-channel MOS transistor is formed, phosphorus (P$^+$) ions are implanted at an accelerated energy of 15 keV and at a dose amount of $1\times10^{15}$ cm$^{-2}$. By this ion implantation, a source and a drain region of the n-channel MOS transistor are formed. In addition, in the n-type well tap region 36, phosphorus ions are also implanted at the same time. Subsequently, annealing is performed at 1,000° C. for 10 seconds, thereby activating the implanted impurity ions.

By forming a cobalt (Co) film 10 nm thick on the substrate followed by heat treatment, a cobalt silicide (CoSi) film 80 is formed on the upper surface of the gate electrode 40, and CoSi films 81 is formed on the surfaces of the source and drain regions 78 and the n-type well tap region 36. An unreacted Co film is removed after the heat treatment.

Figure 8D:
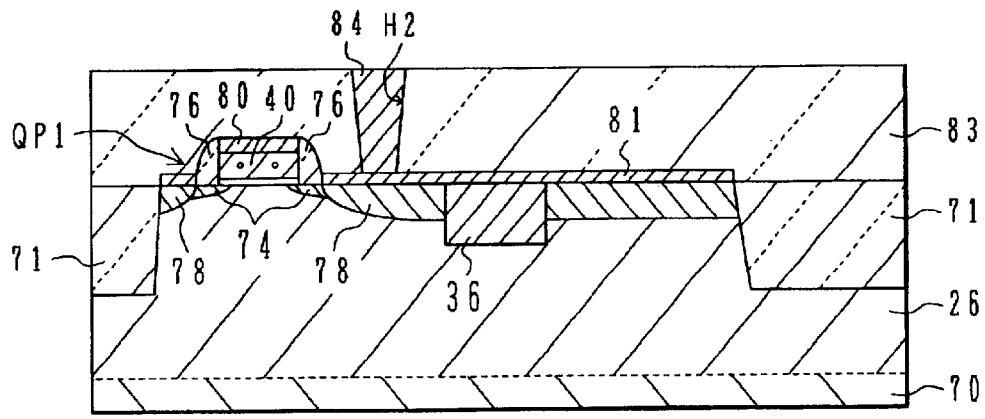

As shown in FIG. 8D, an interlayer insulating film 83 composed of silicon oxide having a thickness of 1,000 nm is formed by CVD. The surface of the interlayer insulating film 83 is planarized by CMP. The via hole H2 is formed in the interlayer insulating film 83. At the same time, all via holes shown in FIG. 4 are formed.

Next, a titanium (Ti) layer 10 nm thick, a titanium nitride (TiN) film 20 nm thick, and a tungsten (W) film 300 nm thick are sequentially deposited. CMP is then performed until the surface of the interlayer insulating film 83 is exposed so as to leave a conductive interlayer connection member 84 in the via hole H2.

Figure 8E:
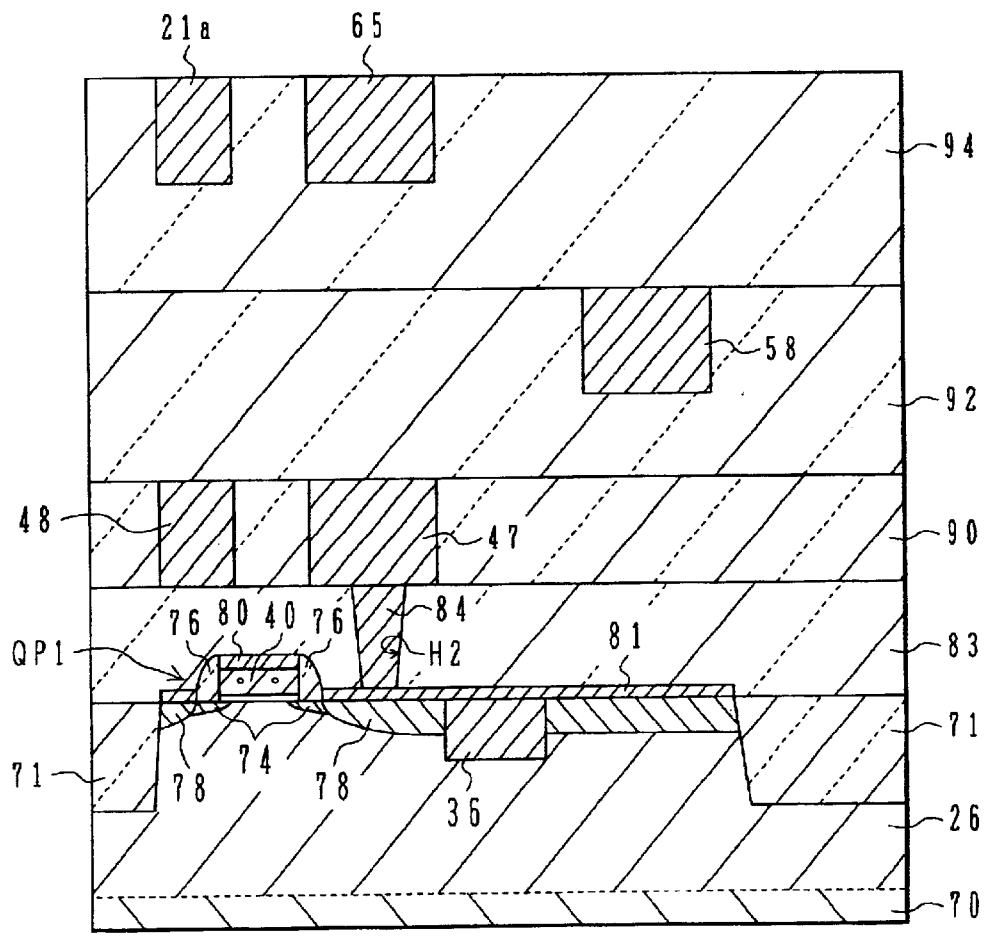

As shown in FIG. 8E, on the interlayer insulating film 83, first wire layers are formed by a single damascene method. Hereinafter, a method for forming wire layers by a single damascene method will be briefly described.

A wire insulating film 90 composed of silicon oxide having a thickness of 500 nm is formed by CVD. Wiring grooves corresponding to the first wire layers shown in FIG. 5 are formed in the wire insulating film 90. A tantalum (Ta) layer 20 nm thick and a copper (Cu) layer 1,000 nm thick are formed, and CMP is then performed, thereby leaving the first wire layers in the wiring grooves. Accordingly, the first wire layers 47, 48, and the like and first intermediate conductive layers 45, 50, and the like shown in FIG. 5 are formed.

Above the wire insulating film 90, second wire layers are formed by a dual damascene method. Hereinafter, an example of a method for manufacturing wire layers by a dual damascene method will be briefly described.

On the wire insulating film 90, an interlayer insulating film 92 composed of silicon oxide having a thickness of 1,000 nm is formed by CVD. The via holes shown in FIG. 6 are formed in the interlayer insulating film 92. In addition, wiring grooves corresponding to the second wire layers shown in FIG. 6 are also formed.

A tantalum layer 20 nm thick and a copper layer 1,000 nm thick are sequentially formed, and CMP is then performed, thereby leaving the tantalum layer and the copper layer in the wiring grooves and the via holes. The power supply voltage line 58, the wire layers 55, and the main word lines 17 shown in FIG. 6 are formed.

On the interlayer insulating film 92, an interlayer insulating film 94 is formed, and the bit lines 21a, the ground voltage lines 65, and the inverted bit lines 21b, which are shown in FIG. 7, are formed in the interlayer insulating film 94 by a dual damascene method.

In the embodiment described above, as shown in FIG. 8E, the power supply voltage Vdd is applied to the n-type well tap region 36 via the interlayer connection member 84 which is used for applying the power supply voltage Vdd to the source region 78 of the p-channel MOS transistor QP1. In a manner similar to the above, the ground voltage Vss is applied to the p-type well tap region 35 via the interlayer connection member in the via hole H1 provided at a position overlapping the source region S of the n-channel MOS transistor QN1 shown in FIG. 4.

Figure 11:
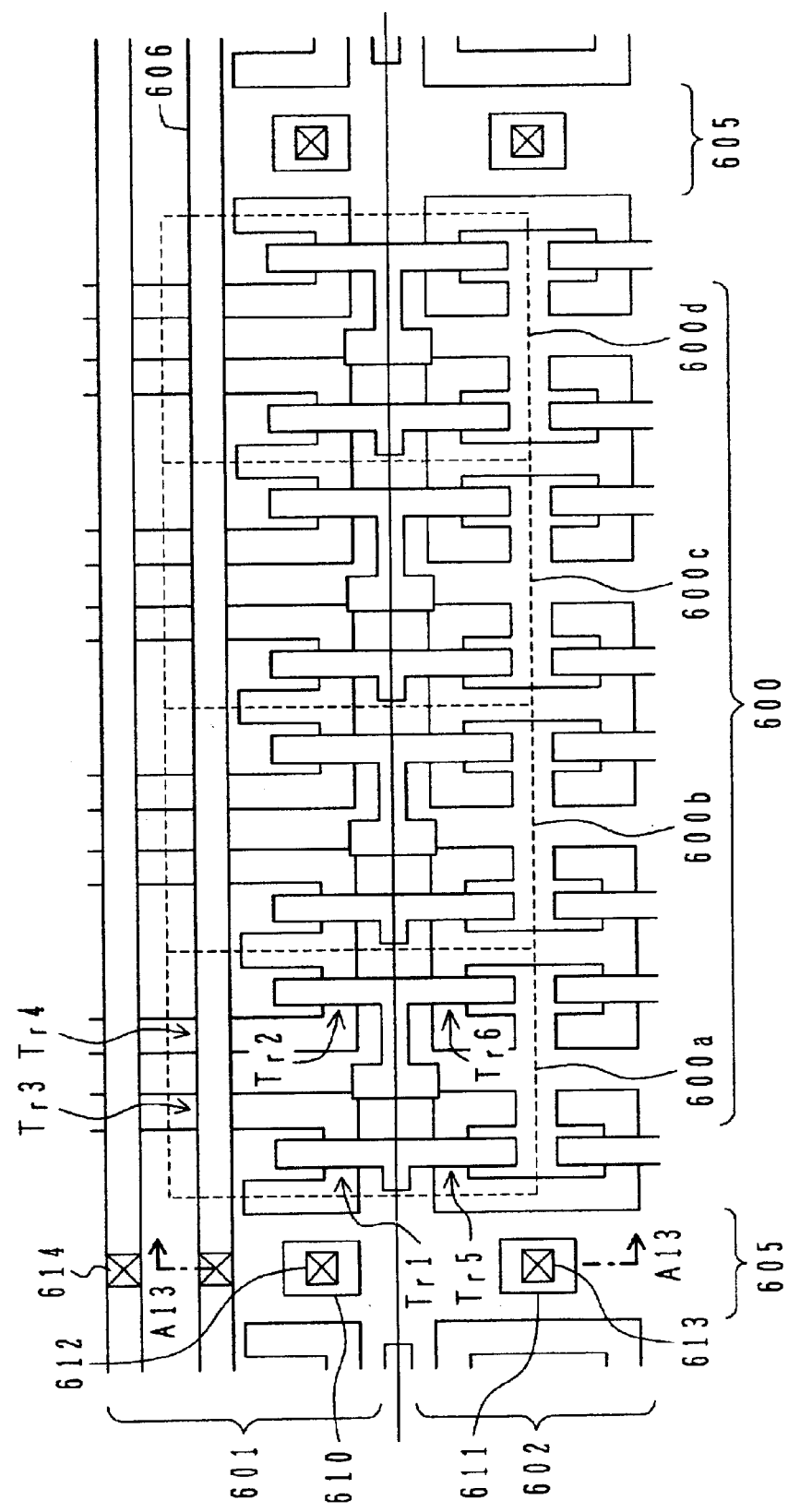
FIG. 11 is a plan view of another conventional SRAM.
Figure 12:
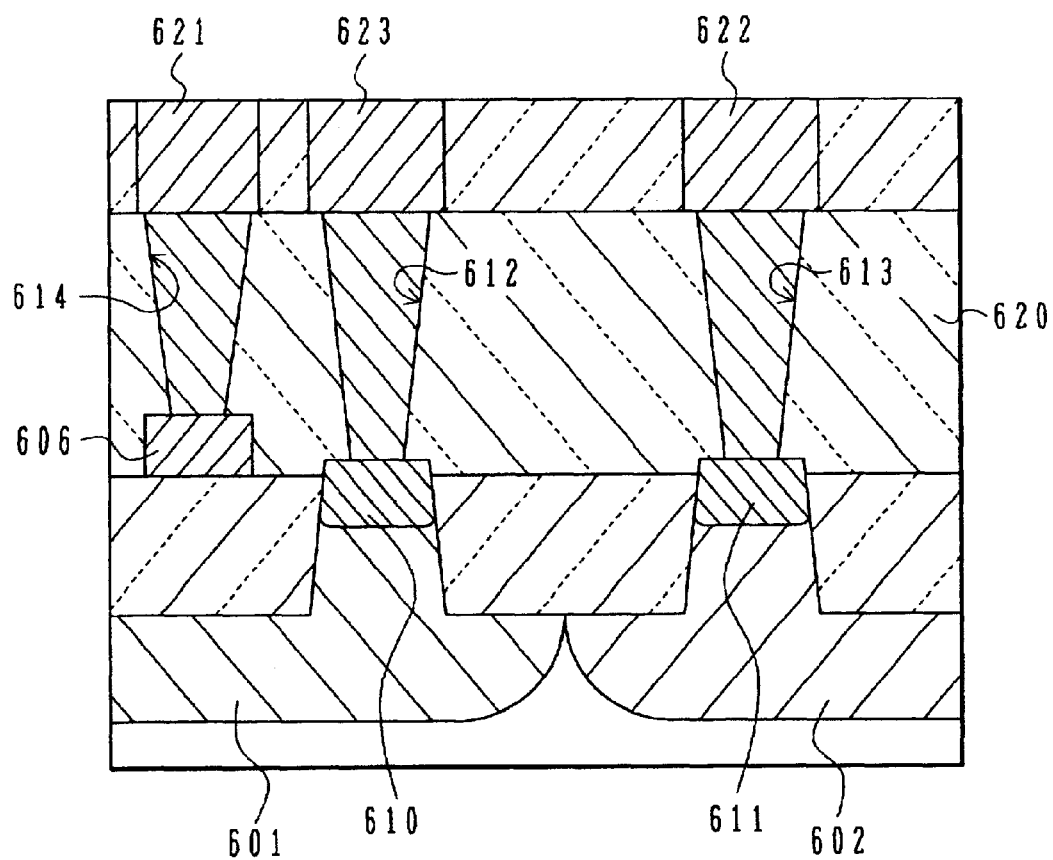
FIG. 12 is a cross-sectional view of another conventional SRAM.
Figure 13:
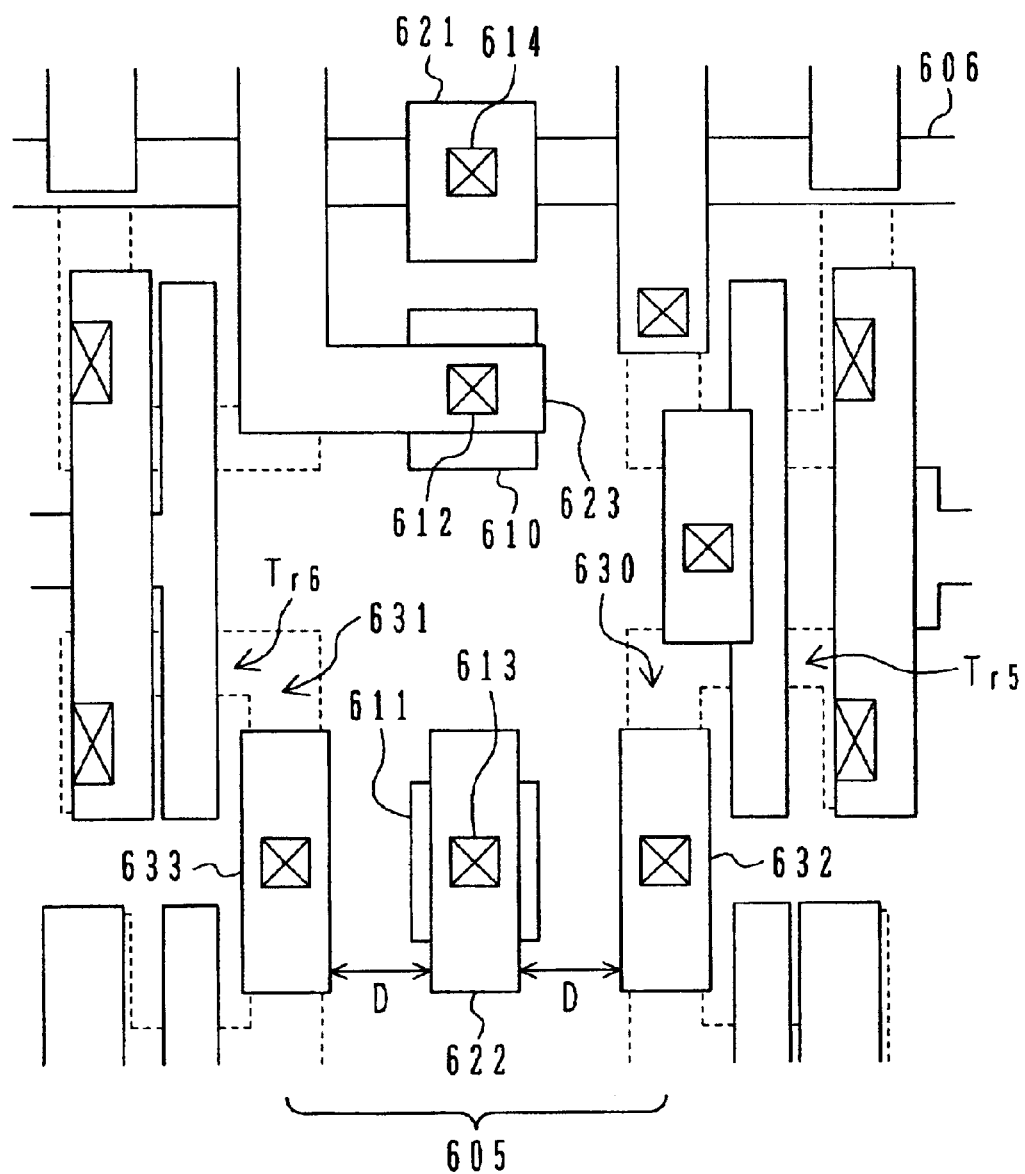
FIG. 13 is a plan view of a connection portion of another conventional SRAM.

As described above, in the SRAM according to this embodiment, the via hole 613 exclusively used for the n-type well tap region 611 of the conventional SRAM shown in FIGS. 11 to 13 and the via hole 612 exclusively used for the p-type well tap region 610 are not necessary.

In the conventional example shown in FIG. 13, in the connection portion 605 between the memory cell arrays, the intermediate conductive layer 632 connected to the source region of the MOS transistor Tr5, the intermediate conductive layer 622 connected to the n-type well tap region 611, and the intermediate conductive layer 633 connected to the source region of the MOS transistor Tr6 are disposed in the row direction. Between these intermediate conductive layers, the minimum distance D of the pattern of the first wire layers is ensured. The intermediate conductive layer 621 used for word contact is provided at the same position as the intermediate conductive layer 622 in the column direction.

In contrast, in this embodiment, as shown in FIG. 4, in the column of the active region 30a, the source region of the p-channel MOS transistor QP1 of one memory cell and the source region of the p-channel MOS transistor QP2 of another memory cell adjacent to the memory cell mentioned above are continuously formed, and one via hole H2 is provided. In a manner similar to the above, the source region of the n-channel MOS transistor QN1 of one memory cell and the source region of the n-channel MOS transistor QN2 of another memory cell adjacent to the memory cell mentioned above are continuously formed, and one via hole H1 is provided. The via hole HW used for word contact is provided at a position different from those of the via holes H1 and H2 in the row direction.

As shown in FIG. 5, in the boundary region between the memory cell arrays adjacent to each other in the row direction, the two patterns of the first wire layer 46 and the intermediate conductive layer 45 for word contact are disposed in the row direction. In addition, the first wire layer 47 is provided at the same position in the row direction as that of the first wire layer 46. Compared to the conventional case shown in FIGS. 11 and 13, the number of the first wire layers provided in the row direction in the boundary region between the memory cell arrays is decreased from three to two. Accordingly, the actual area occupied by the memory cell can be decreased.

In the conventional SRAM shown in FIG. 11, for example, the lateral width of each of the memory cells 600a to 600d is 1.2 $\mu$m, and the width of the connection portion 605 is approximately 1 $\mu$m. That is, the length of the four memory cells in the row direction is approximately 5.8 $\mu$m. On the other hand, in the SRAM of this embodiment shown in FIG. 2, the lateral width of each of the memory cells 10b and 10c is 1.2 $\mu$m, and the lateral width of each of the memory cells 10a and 10d is approximately 1.4 $\mu$m. That is, the length of the four memory cells in the row direction is approximately 5.2 $\mu$m. As described above, in the SRAM of this embodiment, the area of the memory cell can be decreased by approximately 10% compared to the conventional SRAM shown in FIG. 11.

In the SRAM according to the embodiment described above, disconnection of the CoSi film 81 shown in FIG. 8E occurs infrequently at the boundary between the p-type source region 78 and the n-type well tap region 36. However, since the n-type well 26 extends in the lateral direction in the figure as shown in FIG. 3, and hence, a plurality of the n-type well tap regions 36 is provided in one n-type well. Accordingly, even when the breakage of the wire layer occurs at one n-type well tap region 36, the potential of the n-type well 26 is fixed at a power supply voltage Vdd. As a result, problems of circuit operation will not occur.

Next, referring to FIGS. 9A and 9B, the cases in which a well tap region equivalent to that of the embodiment described above is applied to a logic circuit element and is applied to the SRAM as described above will be described, and the different effects obtained therefrom will also be described.

Figure 9A:
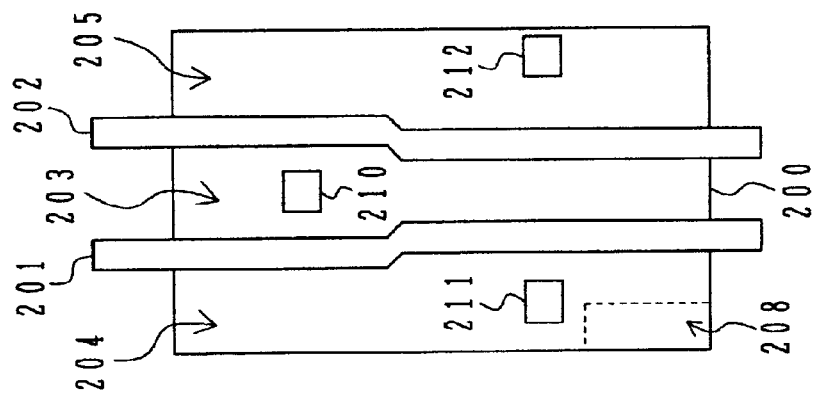
FIGS. 9A and 9B are plan views of an element having the structure in which well tap regions according to an embodiment of the present invention is applied to a logic circuit element.

FIG. 9A shows a plan view of two MOS transistors of a logic circuit device. Two gate electrodes 201 and 202 are provided to pass through an active region 200. An n-type source region 203 is provided between the gate electrodes 201 and 202, and n-type drains 204 and 205 are provided outside the gate electrodes 201 and 202, respectively.

A p-type well tap region 208 is connected to the source region 203. A via hole 210 is provided in the source region 203, and in the drain regions 204 and 205, via holes 211 and 212 are provided, respectively. This arrangement corresponds to, for example, that of the n-channel MOS transistors QN1 and QN2 shown in FIG. 4.

Figure 9B:
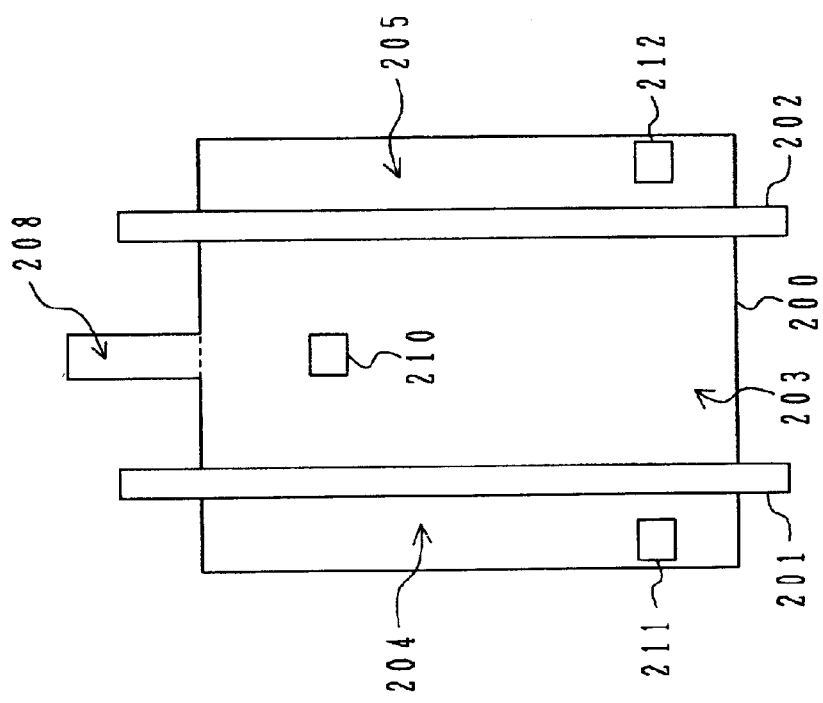

In FIG. 9B, the structure in which the p-type well tap region 208 is provided outside the two gate electrodes 201 and 202 is shown. Since the p-type well tap region 208 is not provided between the gate electrodes 201 and 202, the distance between the gate electrodes 201 and 202 can be decreased. Accordingly, in logic circuit elements, in order to improve the degree of integration, the well tap region is not preferably connected to the source region provided between the two gate electrodes.

On the other hand, in the embodiment shown in FIG. 4, the via hole H1 to be connected to the source region and the p-type well tap region 35 are provided between the gate electrodes 40 and 41 in the column of the active region 30a, and in addition, the via hole HW for word contact is also provided. As shown in FIG. 5, the first wire layer 46 connected to the via hole H1 extends in the longitudinal direction in the figure and passes at the side of the via hole HW for word contact. Accordingly, the via hole H1 and the via hole HW must be provided at different positions from each other in the lateral direction.

That is, in the column of the active region 30a, a space in which two via holes are provided is secured between the gate electrodes 40 and 41. Accordingly, even when the p-type well tap region 35 is provided between the gate electrodes 40 and 41, it is not necessary to further increase the distance between the gate electrodes 40 and 41. As a result, in the case of the SRAM, differing from the case of the logic circuit element, even when the well tap region is connected to the source region between the two gate electrodes, the degree of integration is not decreased.

Heretofore, the present invention has been described with reference to the embodiments; however, the present invention is not limited thereto. For example, it is apparent to those who skilled in the art that various modifications, improvements, combinations may be performed without departing from the scope and the spirit of the present invention.

What is claimed is:

1. A semiconductor device comprising:
    a plurality of repeating units repeatedly provided on a surface of a semiconductor substrate in a first direction and a second direction crossing to the first direction, each repeating unit comprising a plurality of memory cells, each memory cell comprising at least one first-conductivity-type channel MOS transistor having a first-conductivity-type source region, a first-conductivity-type drain region, and a gate electrode;
    a second-conductivity-type well provided in a surface layer of the semiconductor substrate, the second-conductivity type well extending over the plurality of the repeating units disposed in the first direction, the first-conductivity-type channel MOS transistor of each memory cell being provided on the second-conductivity-type well;
    a second-conductivity-type well tap region provided in only one of the plurality of the memory cells in each repeating unit and in the second-conductivity-type well;
    an interlayer insulating film covering the surface of the semiconductor substrate; and
    a first interlayer connection member which is provided in the memory cell having the second-conductivity-type well tap region in each repeating unit or in the memory cell adjacent thereto and which penetrates the interlayer insulating film, the first interlayer connection member being connected to at least the source region of one of the first-conductivity-type channel MOS transistors of the memory cell in which the first interlayer connection member is provided and to the second-conductivity-type well tap region.

2. A semiconductor device according to claim 1, further comprising:
    a metal silicide layer covering from the upper surface of the source region of the first-conductivity-type channel MOS transistor being connected to the first interlayer connection member, to the upper surface of the second-conductivity-type well tap region,
    wherein the first interlayer connection member is electrically connected to the source region of the first-conductivity-type channel MOS transistor and to the second-conductivity-type well tap region via the metal silicide layer.

3. A semiconductor device according to claim 1,
    wherein the source region connected to the first interlayer connection member is connected to the source region of at least one of the first-conductivity-type channel MOS transistor of the memory cell adjacent to the memory cell provided with the first interlayer connection member.

4. A semiconductor device according to claim 1,
    wherein each memory cell comprising a first inverter, a second inverter, and at least one transfer MOS transistor, each of the first inverter and the second inverter comprising a first-conductivity-type channel MOS transistor having a first-conductivity-type source region, a first-conductivity-type drain region, and a gate electrode, the transfer MOS transistor having a first-conductivity-type source region, a first-conductivity-type drain region, and a gate electrode,
    an output from the first inverter is input to the second inverter, an output from the second inverter is input to the first inverter, and the output from the first inverter input to an electronic circuit formed on the semiconductor substrate via the transfer MOS transistor, and
    the source region connected to the first interlayer connection member is the source region of the first-conductivity-type channel MOS transistor constructing the first inverter.

5. A semiconductor device according to claim 4,
    wherein the first inverter of each memory cell further comprises a second-conductivity-type channel MOS transistor having a second-conductivity-type source region, a second-conductivity-type drain region, and a gate electrode, the drain region of the second-conductivity-type channel MOS transistor being connected to the drain region of one of the first-conductivity-type channel MOS transistors constructing the first inverter, and the semiconductor device further comprising:
    a first-conductivity-type well which is provided in a surface layer of the semiconductor substrate extending over the plurality of the repeating units disposed in the first direction, the second-conductivity-type channel MOS transistor of each memory cell being provided on the first-conductivity-type well;

a first-conductivity-type well tap region provided in at least one of the plurality of memory cells in each repeating unit and in the first-conductivity-type well; and a second interlayer connection member which is provided in the memory cell having the first-conductivity-type well tap region in each repeating unit or in the memory cell adjacent thereto and which penetrates the interlayer insulating film, the second interlayer connection member being connected to at least the source region of the second-conductivity-type channel MOS transistor of the memory cell in which the second interlayer connection member is provided and to the first-conductivity-type well tap region.

6. A semiconductor device according to claim 5, wherein the first interlayer connection member and the second interlayer connection member are provided in the same memory cell.

7. A semiconductor device according to claim 4, further comprising:

a word line which is provided in the plurality of repeating units disposed in the first direction and which is also used as the gate electrode for the transfer MOS transistor of each memory cell:

a main word line provided on the interlayer insulating film and extending in the first direction; and a third interlayer connection member which is provided in at least one of the plurality of the memory cells of each repeating unit, penetrates the interlayer insulating film, and connects the word line to the main word line.

8. A semiconductor device according to claim 7, wherein the third interlayer connection member is provided in the memory cell adjacent, in the first direction, to the memory cell in which the first interlayer connection member is provided.

9. A semiconductor device according to claim 1, wherein, in the plurality of the repeating units disposed in the second direction, the first interlayer connection members are provided in the memory cells located at the same positions in the first direction.

10. A semiconductor device according to claim 9, further comprising first wirings each provided on the interlayer insulating film and each connecting between the first interlayer connection members of the memory cells adjacent to each other in the second direction, wherein each first wiring passes at the side of the corresponding third interlayer connection member.

11. A semiconductor device comprising:

a first-conductivity-type well provided in a surface portion of a semiconductor substrate and extending in a first direction;

a plurality of active regions, which is repeatedly provided at the surface of the first-conductivity-type well in the first direction and which is composed of first active regions and second active regions, the first active regions having a length in the first direction larger than that of the second active regions and being repeatedly provided after every one or every at least two second active regions;

memory cells repeatedly provided in the first direction corresponding to the active regions, each of the memory cells comprising at least one second-conductivity-type channel MOS transistor in the corresponding active region, each second-conductivity-type channel MOS transistor having a second-conductivity-type source region, a second-conductivity-type drain region, and a gate electrode; and well tap regions for applying a voltage to the well.

12. A semiconductor device according to claim 11, wherein the well tap regions are provided in the first active regions.

* * * * *